United States Patent [19]

Myer

[11] 4,285,760

[45] Aug. 25, 1981

[54] ZONE PURIFICATION OF CYLINDRICAL INGOTS

[75] Inventor: Jon H. Myer, Woodland Hills, Calif.

[73] Assignee: Hughes Aircraft Company, Culver City, Calif.

[21] Appl. No.: 88,270

[22] Filed: Oct. 25, 1979

[51] Int. Cl.³ .............................................. C30B 13/14

[52] U.S. Cl. ........................ 156/617 H; 156/DIG. 70

[58] Field of Search ............... 156/617 H, 617 R, 620, 156/DIG. 71, DIG. 83, DIG. 70; 13/DIG. 1

[56] References Cited

U.S. PATENT DOCUMENTS

| | | | |
|---|---|---|---|
| 2,773,923 | 12/1956 | Smith | 156/617 H |
| 2,967,095 | 1/1961 | Herrick | 156/617 R |
| 2,984,626 | 5/1961 | Leterer | 156/DIG. 71 |
| 3,644,097 | 2/1972 | Knudsen | 156/620 |

FOREIGN PATENT DOCUMENTS

| | | | |
|---|---|---|---|
| 194215 | 2/1965 | Netherlands | 156/617 H |

OTHER PUBLICATIONS

Zone Melting 2nd Ed., Pfann, Wiley & Sons, N. Y., pp. 47–52, 73, 74.

Crystal Growth–Ed. Pamplin, Pergamon Press N.Y., 3/75, pp. 137–138.

*Primary Examiner*—Hiram Bernstein

*Attorney, Agent, or Firm*—David W. Collins; W. H. MacAllister

[57] ABSTRACT

Cylindrical ingots of materials that expand on melting or freezing are purified or zone refined by a process which includes providing a tubular container having both a cylindrical cavity and a slot along its entire length. In zone refining, as is well-known, a heater of a predetermined elevated temperature traverses from one end of a normally solid charge to another at least once to thereby sweep impurities to one end of the charge. During the zone refining process, material which expands on phase change (e.g., solid to liquid) flows into the slot. As a consequence, fractures and other damage to the container and/or zone-refined material are minimized. The substantially round cross section is retained following removal of the excess material from the zone refined ingot after solidification.

3 Claims, 1 Drawing Figure

14

16

12

13

10

11

15

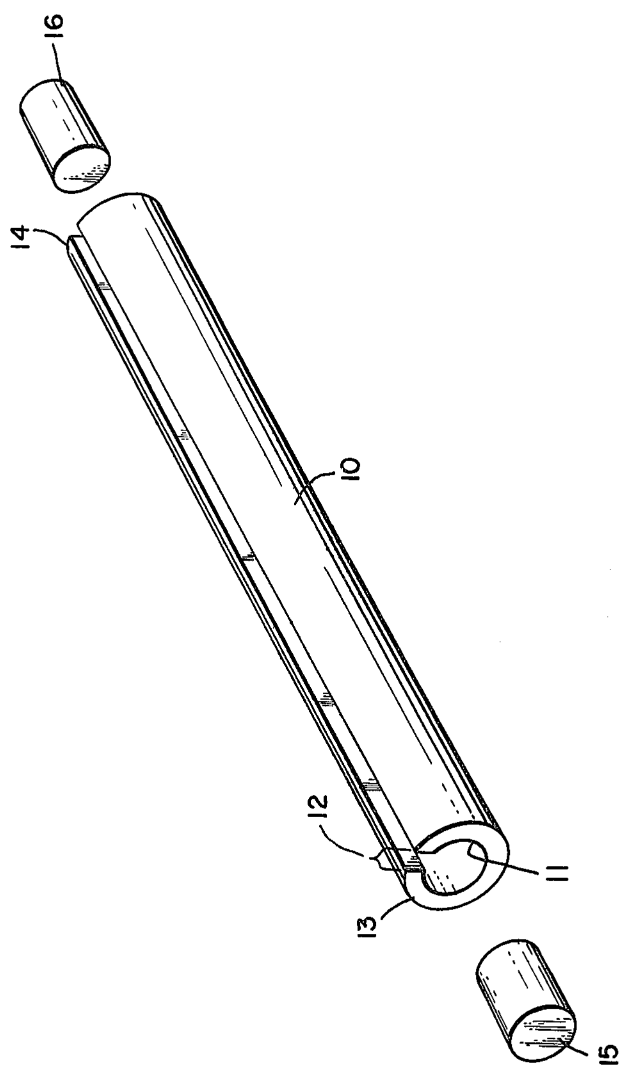
16
14
10
12
11
13
15

ZONE PURIFICATION OF CYLINDRICAL INGOTS

TECHNICAL FIELD

This invention relates to the purification of materials which evidence a volume change upon phase change, and, more particularly, to the zone refining of alkali halide crystals used in the preparation of infrared optical components such as ingots for fiber extrusion.

BACKGROUND ART

It is well-known in the electronic materials art that the impurity density in single crystal ingots of materials may be reduced by establishing a molten zone in such material and then moving the zone along the material one or more times at controlled rates and temperatures. Materials for which this process is well established include silicon, germanium, Group III–V compounds such as gallium arsenide and Group II–VI compounds such as cadmium telluride. During this zone refining process, the molten zone produces continuous melting and crystallization of the ingot, as is also well-known. This process has the effect of increasing the purity of the ingot by, among other things, moving the randomly distributed impurities in the ingot toward one end of the ingot. As a result of the movement of the liquid-solid interface along the length of an ingot, these impurities are swept toward one end of the ingot where they build up in quantity with time during a number of successive zone refining passes and from where they can subsequently be removed.

Examples of references relating to zone refining processes and apparatus include U.S. Pat. Nos. 2,773,923 and 3,909,246 and *Zone Melting,* (2nd Ed.), W. G. Pfann, John Wiley & Sons, New York (1966). Both patents disclose a trough for containing a charge of material to be zone refined. While these patents are useful for zone refining materials for which the final cross sectional configuration is unimportant, they are not suitable for zone refining materials of substantially round cross section, such as cylindrical ingots. Pfann describes the problems of matter transport and container cracking (pp. 47–52).

There is a need for high purity alkali halide crystals of cylindrical configuration (e.g., in the manufacture of fibers), which must be further purified following preparation. Attempts to zone refine such materials employing conventional open containers, such as those disclosed above, result in substantial loss of the round cross section; see the Pfann reference, p. 73. On the other hand, attempts to zone refine such cylindrical materials in completely closed tubular containers result in fracture of the containers. Such fracture occurs for those materials which evidence a volume change upon phase change (e.g., solid to liquid).

SUMMARY OF THE INVENTION

In accordance with the invention, normally solid material having a substantially round cross section and which evidences a volume change upon phase change is zone refined by a process which comprises:

(a) containing a charge of the material in a cylindrical cavity defined by a container having a volume expansion space along the length of said container;

(b) traversing from one end of the charge to another at least once a zone of a predetermined elevated temperature sufficient to melt a portion of the material, thereby sweeping impurities to one end of the charge; and (c) accomodating expanded material in the volume expansion space. Fractures and other damage to the zone refined material or its container are minimized and the substantially round cross section of the material is retained.

BRIEF DESCRIPTION OF THE DRAWINGS

The FIGURE is a perspective view of apparatus suitable in the practice of the invention.

DETAILED DESCRIPTION OF THE INVENTION

The invention will be described with reference to alkali halide crystals, especially mixed thallium halide crystals such as thallium bromoiodide, consisting essentially of about 40 to 45 mole percent TlBr, balance TlI, used in the preparation of infrared optical components such as fibers. Such materials evidence a substantial volume change upon phase change. However, it will be understood that the invention also applies to other materials which evidence a volume change upon phase change. Examples of such other materials include germanium and silicon. By phase change is meant those first order transitions such as melting or freezing.

The present invention reconciles the contradictory requirements for preparing a full cylindrical ingot with the need for accomodating expansion during melting or freezing. Attempts to zone refine cylindrical ingots of alkali halides such as thallium bromoiodide in a container configured to accept such ingots result in container rupture caused by the formation of a sealing plug of solidified material which inhibits release of the pressure developed during melting of the zone. This problem is inherent in the zone melting of materials that expand during melting or freezing, since solidified material that was melted in previous cycles often forms a tight fitting plug over the newly melting zone.

By performing the zone melting process substantially horizontally and providing a volume expansion space above the molten zone, the incremental volume formed by the phase change may be accomodated without increasing the pressure in the container. The principle of the invention is illustrated in the FIGURE, which shows a container 10 having a cylindrical cavity 11. The container itself is conveniently cylindrical, with parallel end surfaces 13, 14. A loosely fitting cylindrical ingot (not shown) of material to be zone refined is inserted in the cavity, which is of dimensions sufficient to accomodate the ingot.

A volume expansion space 12 of substantially constant width runs the length of the container and provides space for the expanding material during the zone refining process. Both ends of the container are plugged with plugs 15, 16. Traversal at least once of a hot zone along the container sufficient to melt a portion of the material contained therein will sweep impurities toward one end of the ingot and assure purification of the material.

The volume expansion space may or may not penetrate the wall of the container. While the FIGURE depicts a container with the volume expansion space communicating between the inside of the container and the outside, other configurations, such as a "key-hole" slot formed along the interior of the container, may also be employed.

Volume expansion resulting from localized melting or freezing of the confined zone is accommodated by the volume expansion space or slot. After at least one traverse, this slot will partially fill and form a ridge on the finished ingot. This ridge is easily removed by mechanical processing such as grinding and polishing.

Normally solid (i.e., solid under standard temperature and pressure conditions) material having a substantially round cross section and which evidences a volume change upon phase change is zone refined to substantially remove impurities therefrom by a process which comprises:

(a) containing a charge or ingot of the material in a cylindrical cavity 11 defined by a container 10 having a volume expansion space 12 along the length of the container;

(b) traversing from one end of the ingot to another at least once a zone of a predetermined elevated temperature sufficient to melt a portion of the material, thereby sweeping impurities to one end of the ingot; and (c) accomodating expanded material in the volume expansion space 12, whereby pressure buildup is eliminated, fractures and other damage to the zone refined material or the container 10 are minimized and the substantially round cross section of the ingot is retained.

The material of the container 10 may comprise any refractory material such as borosilicate glass, silica, alumina and the like. The length and inside diameter dimensions of the container are chosen to just contain a substantially cylindrical ingot which is to be zone refined.

The width of the slot 12 is related to the size of the ingot. The minimum width is that which may be obtained by any convenient process such as wire saw and the like. The maximum width of the slot is dictated by conditions of the final ingot after zone refining. It is desired that the ingot retain its substantially full round cross section after zone refining. The larger the ingot, the wider the slot may be. As an example, for zone refining an ingot of thallium bromoiodide having a diameter of 6 mm, a slot width of 1 mm is adequate to retain the substantially round cross section of the fiber.

The thickness of the container is immaterial other than it be thick enough to withstand normal handling and not so thick that it adversely affects thermal gradients. As is well-known, steep thermal gradients are desired for zone refining. For zone refining thallium bromoiodide, which melts at about 414° C., a four-turn heating coil 1 cm wide generates a thermal gradient of about 100°/mm, which is considered adequate. For a 6 mm diameter ingot, a wall thickness of the container of about 0.5 to 0.7 mm is sufficient to meet the foregoing criteria.

Plugs 15,16 may comprise the same material as the container or the same material as the ingot being zone refined so long as, in the latter case, the plugs are not passed through the heating coil.

A cast ingot of substantially round cross section is used to charge the container. Powdered material has been found to result in a finished product having too many voids. However, loose power may be sprinkled in the volume expansion space in order to compensate for voids between the ingot and the container and to ensure a substantially fully round cross section of the finished ingot.

In order to compensate for matter transport caused by volume change during phase change and by surface tension, the container is inclined at a slight angle determined by the properties of the material; see, e.g., the Pfann reference, pp. 48–50.

EXAMPLE

A mixed melt ingot of thallium bromoiodide, prepared from a mixture of 45.7 mole percent TlBr and 54.3 mole percent TlI and in the form of a cylinder 100 mm long and 6 mm diameter, was zone refined in apparatus similar to that depicted in the FIGURE. A quartz container of length 140 mm and ID 6.1 mm was employed, with a slot of 0.6 to 1.0 mm in width running the length of the container. End plugs of thallium bromoiodide were employed. A small amount of thallium bromoiodide powder was sprinkled substantially uniformly along the slot to ensure substantially fully round cross section of the finished crystal.

A four-turn heating coil 1 cm wide traversed twenty-three times along the length of the container. A thermal gradient of about 100° C./mm and a temperature of about 500° C. in the zone were established. It was found that the combined effects of phase change and surface tension caused a forward matter transport. To compensate, the container was tilted at about 6°, making the climb at this small angle during its slow forward motion.

Upon completion of the zone refining operation, the crystal was removed from its container. A ridge of expanded material, running along the length of the crystal, was easily removed by snipping off.

Prior to zone refining, the crystal was of cloudy appearance; following twenty-three passes of the molten zone, a crystal of exceptional clarity was obtained. As is well-known, the transparency of thallium bromoiodide crystals is adversely affected by the presence of impurities.

Thus, an alkali halide crystal of substantially round cross section and which expands upon melting was purified without damage to the crystal or the container. The substantially round cross section of the crystal was retained.

What is claimed is:

1. A zone refining process for substantially removing impurities from a mixed thallium halide material which comprises:

(a) containing a charge of the material in a cylindrical cavity defined by a container maintained substantially horizontal and having a volume expansion space along the length of said container and above said cavity, said volume expansion space having a width no wider than that necessary to retain a substantially round cross-section of said charge following zone refining;

(b) traversing from one end of said charge to another at least once a zone of a predetermined elevated temperature sufficient to melt a portion of said material, thereby sweeping impurities to one end of said charge; and (c) accomodating expanded material in said volume expansion space, whereby pressure buildup is eliminated, fractures and other damage to the zone refined material or its container are minimized and said substantially round cross-section is retained.

2. The process of claim 1 in which following said zone refining process, the expanded portion of said material is removed from said charge.

3. The process of claim 1 in which said crystal consists essentially of TlBr and TlI, in proportions ranging from about 40 to 45 mole percent TlBr, balance TlI.

* * * * *